United States Patent
Kaibel et al.

(10) Patent No.: US 7,689,885 B2
(45) Date of Patent: Mar. 30, 2010

(54) INTEGRATED CIRCUIT AND METHOD FOR IDENTIFYING PROPAGATION TIME ERRORS IN INTEGRATED CIRCUITS

(75) Inventors: Martin Kaibel, Germering (DE); Olivier Barondeau, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 252 days.

(21) Appl. No.: 11/752,785

(22) Filed: May 23, 2007

(65) Prior Publication Data
US 2008/0005635 A1 Jan. 3, 2008

(30) Foreign Application Priority Data
May 23, 2006 (DE) .................. 10 2006 024 507

(51) Int. Cl.
*G01R 31/28* (2006.01)
(52) U.S. Cl. ...................... 714/731; 714/726
(58) Field of Classification Search ............... 714/724, 714/725, 726, 733, 734, 731, 699; 713/400
See application file for complete search history.

(56) References Cited

U.S. PATENT DOCUMENTS

| | | | |
|---|---|---|---|
| 5,434,996 A * | 7/1995 | Bell | 713/400 |
| 5,745,498 A | 4/1998 | Adams et al. | |
| 6,442,722 B1 | 8/2002 | Nadeau-Dostie et al. | |
| 6,467,044 B1 | 10/2002 | Lackey | |
| 6,738,921 B2 | 5/2004 | Lo et al. | |
| 6,861,867 B2 | 3/2005 | West et al. | |
| 6,966,021 B2 | 11/2005 | Rajski et al. | |
| 6,976,199 B2 | 12/2005 | Berry, Jr. et al. | |
| 7,227,921 B2 * | 6/2007 | Butler et al. | 375/376 |
| 7,447,961 B2 * | 11/2008 | Tan | 714/726 |
| 2003/0084390 A1 | 5/2003 | Tamarapallie et al. | |
| 2005/0110549 A1 | 5/2005 | Baradie et al. | |
| 2005/0235186 A1 | 10/2005 | Wang et al. | |
| 2005/0240847 A1 | 10/2005 | Nadeau-Dostie et al. | |

FOREIGN PATENT DOCUMENTS

DE 10148134 4/2007

(Continued)

OTHER PUBLICATIONS

Wikipedia, Automatic test pattern generation, Wikipedia, the free encyclopedia, 3 pp.

(Continued)

*Primary Examiner*—Phung M Chung
(74) *Attorney, Agent, or Firm*—Dicke, Billig & Czaja PLLC

(57) ABSTRACT

An integrated circuit is disclosed. In one embodiment, for each clock domain there is at least one clock driver which is situated in the integrated circuit and which drives circuits situated in the clock domain. Each clock driver in the clock domain contains a clock input and an enable input, and its output outputs the clock received at the clock input if an enable signal is applied to the enable input. The clock driver receives a clock derived from the signal at the functional clock input, and the enable signal is connected in line with the values stored in the signal sequence registers if there is a signal change at the scan clock input when the scan chain shift mode has been switched off.

17 Claims, 5 Drawing Sheets

FOREIGN PATENT DOCUMENTS

| EP | 1430321 | 12/2004 |
|----|---------|---------|
| EP | 1179737 | 3/2005 |
| EP | 1421397 | 3/2005 |
| EP | 1584938 | 10/2005 |

OTHER PUBLICATIONS

Beck et al., Logic Design for On-Chip Test Clock Generation-Implementation Details and Impact on Delay Test Quality, 6 pp.

Beck et al., Measures to Improve Delay Fault Testing on Low-Cost Testers - A Case Study, 6 pp. 2005.

Iyengar et al., GHz-Speed Structural Test Using On-Chip Clocking, 2nd IEEE International GHz/Gbps Test Workshop, Nov. 10-11, 2005, 10 pp.

Wikipedia, Automatic test pattern generation, Wikipedia, the free encyclopedia, 3 pp. May 4, 2006.

Lin et al., High-Frequency, At-Speed Scan Testing, IEEE, Sep.-Oct. 2003, 10 pp.

Beck et al., Logic Design for On-Chip Test Clock Generation-Implementation Details and Impact on Delay Test Quality, 6 pp.

Beck, et al., "Measures to Improve Delay Fault Testing on Low-cost Tester - A Case Study", 6 pgs. 2005.

Iyengar, et al., "GHz-Speed Structural Test Using On-Chip Clocking", 2nd IEEE, Nov. 2005, 10 pgs.

Lin, et al., High-Frequency, At-Speed Scan Testing. In: IEEE Design & Test of Computers, 2003, vol. 20, nr. 5, pp. 17-25.

\* cited by examiner

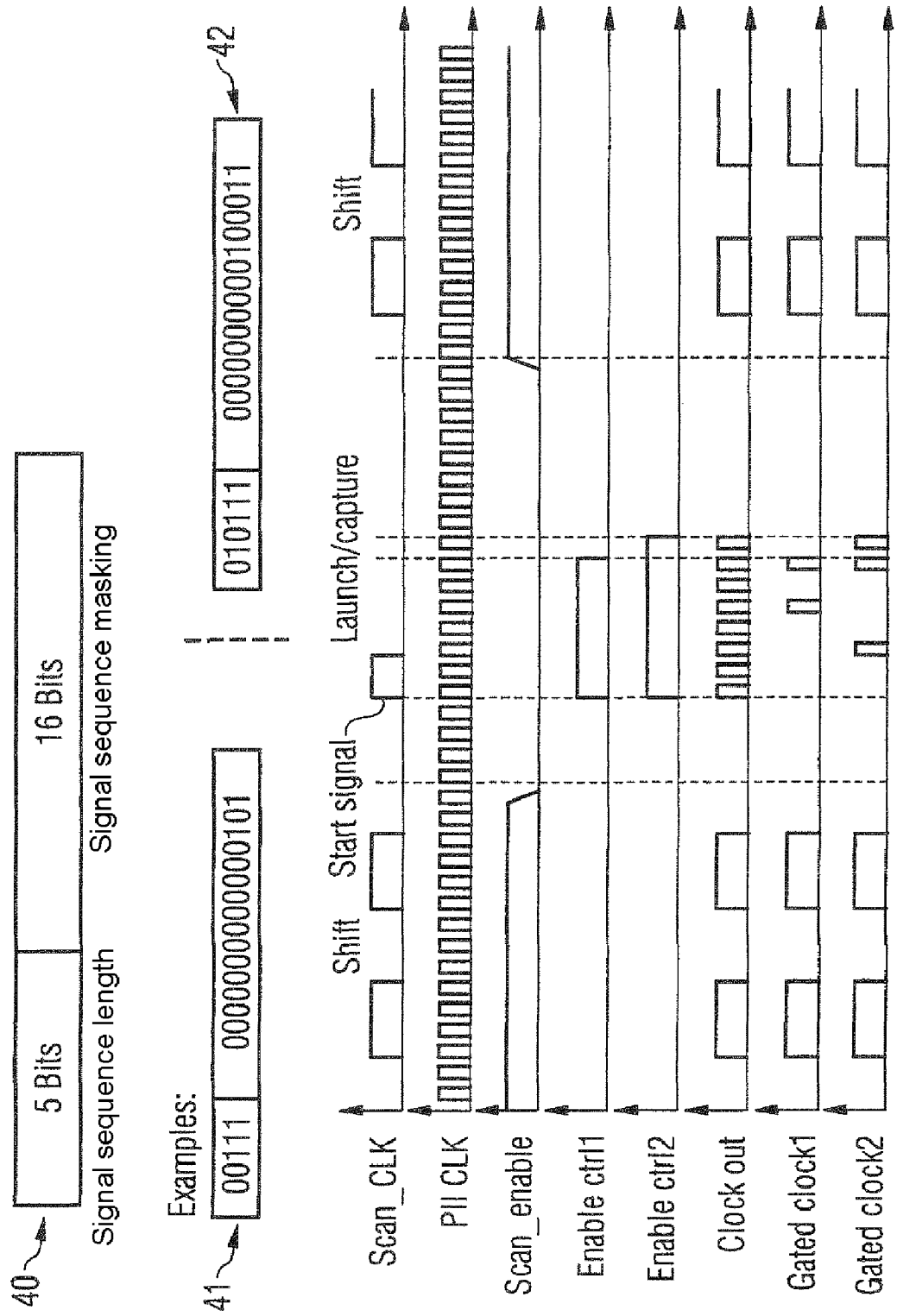

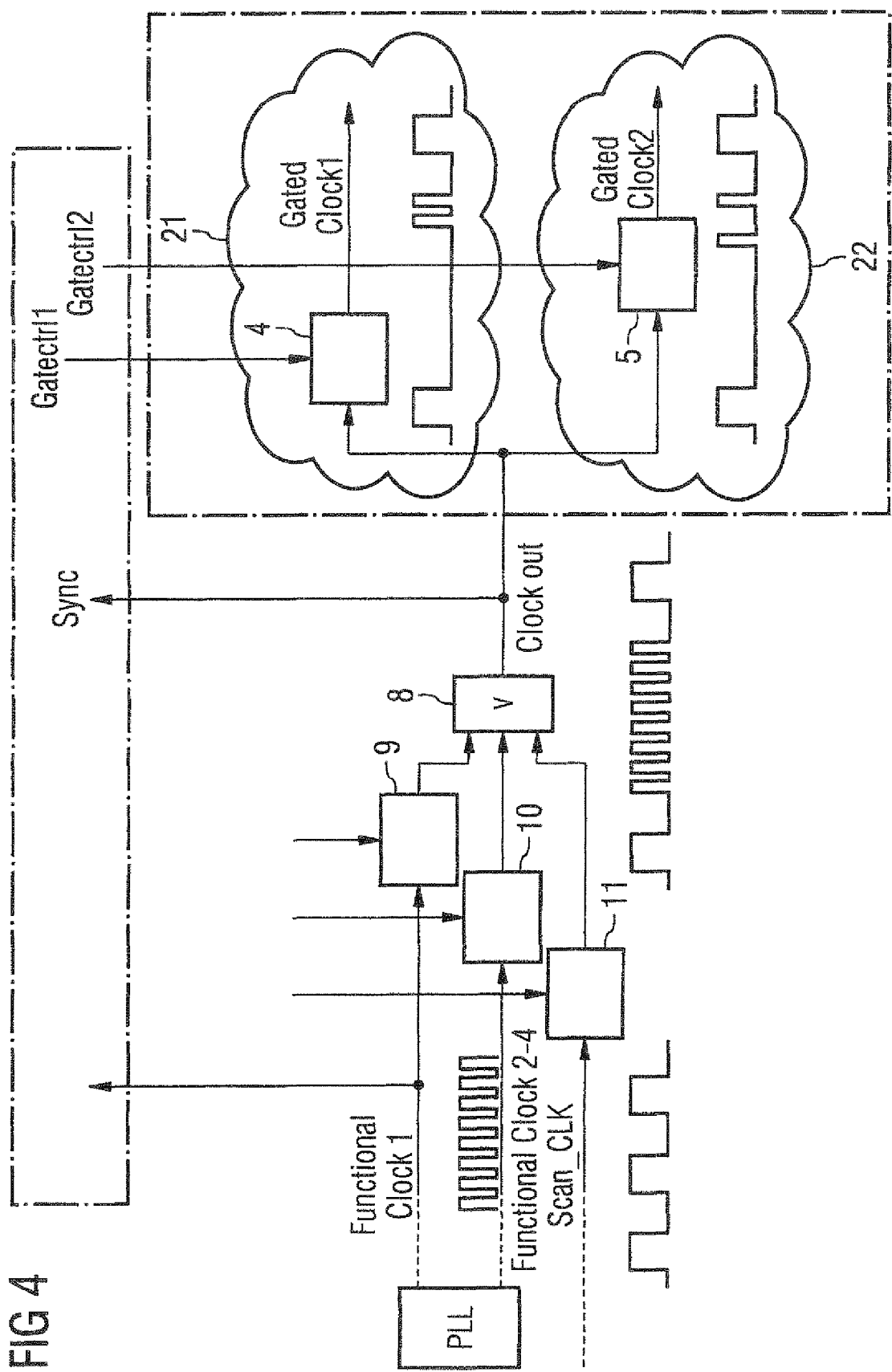

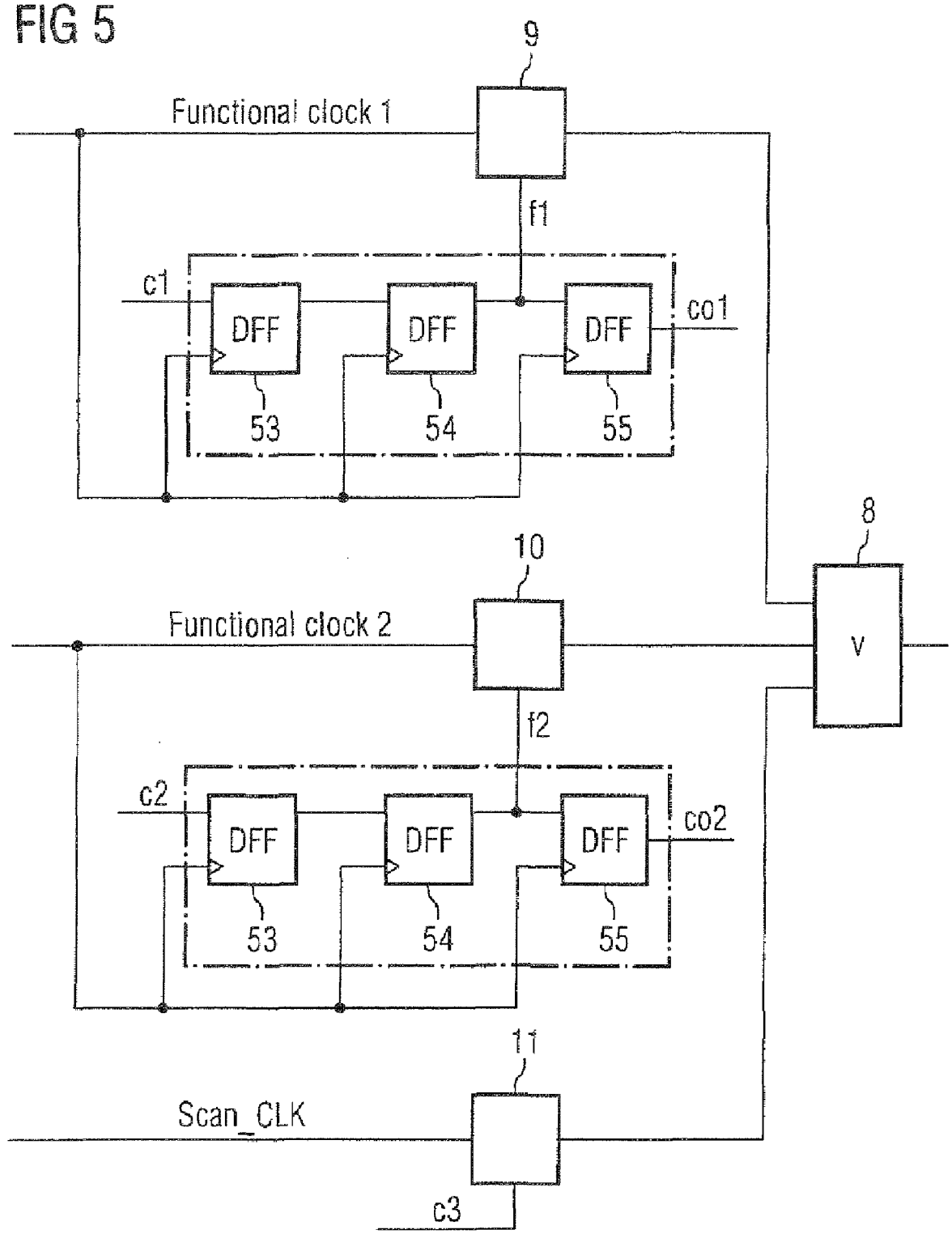

INTEGRATED CIRCUIT AND METHOD FOR IDENTIFYING PROPAGATION TIME ERRORS IN INTEGRATED CIRCUITS

CROSS-REFERENCE TO RELATED APPLICATIONS

This Utility patent application claims priority to German Application No. DE 10 2006 024 507.5, filed May 23, 2006, which is herein incorporated by reference.

BACKGROUND

The invention relates to an integrated circuit and to a method for operating integrated circuits including identifying propagation time errors in integrated circuits.

Integrated circuits have the problem that propagation time errors occur. There is the risk that excessively fast or excessively slow signal propagation times will result in malfunctions in the integrated circuit. The higher the clock frequencies, the greater the risk of the occurrence of propagation time errors, which becomes noticeable in digital circuits from approximately 300 MHz upwards.

US 2003/0084390 exhibits a method for testing integrated circuits having different clock drivers. The flipflops in the circuit can be connected as shift registers in a scan process. In order to identify propagation time errors, data are first of all inserted into scan cells at a relatively slow clock rate in order to put the integrated circuit into a particular state. For the actual test which follows, clock pulses are generated from a PLL. The clock pulses produced in this manner are also referred to as launch/capture pulses, with the launch pulse initiating a signal which is received by using the capture pulse. To this end, clock pulses are produced whose frequency is equal to the application frequency of the integrated circuit, which allows propagation time errors to be identified.

The programming of the propagation time error test is still complex, however.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention is illustrated in more detail in the drawings with reference to an exemplary embodiment.

FIG. 3 illustrates the signal profile for nodes situated in the integrated circuit during a method for identifying propagation time errors.

FIG. 4 illustrates signal profiles for nodes illustrated in FIG. 2.

FIG. 5 illustrates details from a synchronization circuit for clock drivers from FIG. 2.

DETAILED DESCRIPTION

Figure 1:
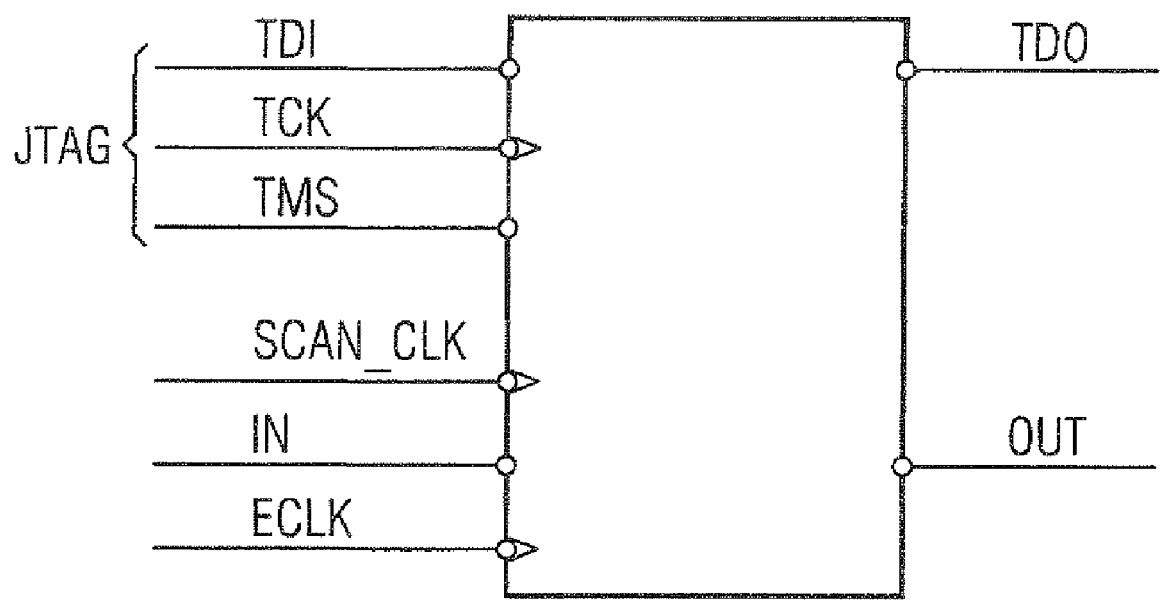
FIG. 1 illustrates a circuit diagram with the input signals for an integrated circuit based on the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a method and an integrated circuit which allow propagation time errors to be identified with little control complexity.

One embodiment provides a method for identifying propagation time errors in integrated circuits. The integrated circuit contains a multiplicity of scan cells which are connected as shift registers in a scan chain shift mode. In addition, the integrated circuit contains a multiplicity of clock domains. Clock domains are parts of the integrated circuit, with each clock domain being operated by a dedicated clock driver. As clock inputs, the integrated circuit has at least one functional clock input and a scan clock input.

In one embodiment, the scan chain shift mode is switched on, so that the scan cells form a shift register. Data are then shifted into the scan test cells. This is done using signal changes at the scan clock input. Clock signals are likewise applied to the functional clock input. In addition, signal sequence registers are programmed. When the scan chain shift mode has been switched off, a multiplicity of clock signals are produced in at least one clock domain in line with the values stored in the signal sequence registers. This clock is produced from the clock at the functional clock input. Next, it is established whether a propagation time error has occurred in the clock domain operated in a preceding method process. The check is usually performed by comparing whether values stored in memory cells in the integrated circuit correspond to expected values.

The scan chain shift mode needs to be clearly distinguished from a mode which in many implementations is referred to as "scan_mode" but merely ensures that the clock inputs are changed over. In the "scan_mode", the scan flipflops are operated with a test clock applied to a test input.

Production of the clock signals from the clock at the functional clock input is initiated by a signal change at the scan clock input. This production of the clock signals needs to occur after the scan chain shift mode has been switched off so that the scan cells are in the mode in which they are during normal, functional operation. To initiate the clock signals, the scan clock input is used, which saves an input pin. The number of input pins is critical to the overall costs of an integrated circuit. Every pin saved, particularly if it is used only for test purposes, reduces the overall costs of the integrated circuit. In addition, the actuation is simplified, since only one signal change is required on the scan clock input in order to produce the clock pulses. The actual appearance of the signal shape of the clock pulses is already stored in the signal sequence registers.

The order of the method processes can be varied. By way of example, the signal sequence registers can be programmed before the scan chain shift mode is switched on. In one embodiment, the clock signals are applied to the functional clock input before the scan chain shift mode is activated. This means that a PLL situated on the chip has sufficient time to lock.

In one embodiment, the test modes are programmed via a JTAG interface. Such an interface is defined in the standard IEEE 1149.1. It contains four or five interface connections. The inputs are "Test Data In (TDI)", "Test Clock (TCK)", "Test Mode Select (TMS)" and optionally "Test Reset (TRST)". In addition, there is an output "Test Data Out (TDO)". The JTAG and the scan test usually use independent interfaces. The JTAG is readily used to put the entire chip into scan_mode by programming the test register. The scan_mode changes over to a different clock input.

If the scan chain shift mode is switched on again in the process of checking for propagation time errors, the values stored in the electrical circuit which are presumed to produce an error can be read out specifically. These data are output by the integrated circuit by using the slow scan clock, which means that the data can be read using relatively simple and hence inexpensive measuring instruments.

In one embodiment, the signal sequence registers are respectively used to store the length of the signal sequences and the values for the signal sequences for each clock domain. Prescribing the length allows two-stage clock generation. In the first stage, a clock driver drives clock signals for the entire duration of the signal sequence, whereas in the second stage, only the clock pulses which are contained in the signal sequence of the specific clock domain are allowed to pass.

If the clock signals are produced for a plurality of clock domains simultaneously in line with the signal sequence registers, it is possible to check propagation times for signals which pass through a plurality of clock domains. By way of example, a signal is produced in a first clock domain and is received in a second clock domain.

In the case of the clock domains, a distinction is drawn between synchronous clock domains and asynchronous clock domains. Synchronous clock domains are operated by the same base clock, for example by the same PLL output. In the case of asynchronous clock domains, the clocks are operated in the clock domains of clocks which are not in sync with one another, for example because they differ in terms of their phase or their frequency. The different clocks are supplied by the different PLL outputs, which may also be associated with different PLLs.

One or more embodiments also relate to a method for fabricating a semiconductor chip in which a semiconductor chip is first of all designed. In this context, a multiplexer is designed which receives a scan clock input and at least one output signal from a PLL as input signals. As output signals, the multiplexer outputs a clock signal for clock inputs of flipflops. The multiplexer is in a form such that in a functional mode of the semiconductor chip the output of the PLL is connected to the clock inputs of the flipflops. In a scan chain shift mode, the signal from a scan clock input is connected to the clock inputs of the flipflops. And finally, in a propagation time test, a selection of the pulses produced by the PLL is connected to the clock inputs of the flipflops. In this context, a selection means that individual pulses in the clock produced by the PLL are gated out.

The multiplexer is designed such that in the propagation time test and in the functional mode the signal runs from the output of the PLL to the flipflops via the same paths. This means that the output of the PLL and the flipflops have no additional gates between them which are connected only in one of the two modes—propagation time test and functional mode. This has the advantage that the path is the same length in both modes. This ensures that the clock path is the same length in the propagation time test and in the functional mode. This means that the fluctuations in the clock are also of the same length, and in a propagation time test involves testing under the same conditions as in the functional mode.

The clock tree is created using the calculated delay times for signals which are produced by the clock output at the highest frequency. This means that the clock tree is created at the highest frequency, and hence at the frequency with the greatest demands. The lower frequencies have lesser demands and therefore do not need to be considered separately in order to create the clock tree. Another advantage is that the paths are the same length in the functional mode and in the propagation time test. Creating the clock tree therefore requires no case distinction between the functional mode and the propagation time test.

To conclude the method, the semiconductor chip designed in this manner is produced materially.

In one embodiment, the paths are designed such that the delay from the clock outputs, which are at a lower frequency than the highest frequency, is no longer than the delay from the clock output at the highest frequency. This means that the fluctuations in the delays at the highest frequency are greatest or are the same size as the delays from the other clock outputs. The delays from the other clock outputs therefore do not need to be considered separately when the clock tree is created.

One or more embodiments also relate to an integrated circuit having a functional clock input, a scan clock input, a multiplicity of scan cells, a signal sequence register and a multiplicity of clock domains. The scan cells are connected as shift registers in a scan chain shift mode and receive the signal at the scan clock input as the clock for the shift register. Each clock domain contains a dedicated clock driver situated in the integrated circuit. The clock domain contains those circuits which are operated by this clock driver.

A clock driver in a clock domain contains a clock input, an enable input and an output. The output outputs the clock received at the clock input if an enable signal is applied to the enable input. The clock driver receives a signal which is derived from the clock at the functional clock input, and also receives the enable signal in line with the values stored in the signal sequence registers if there is a signal change at the scan clock input after the scan chain shift mode has been switched off.

This means that it is possible to use the scan clock input, which otherwise has no function after the scan change shift mode has been switched off, to initiate the actuation of the enable signals. This saves a pin and simplifies actuation.

In one embodiment, a clock input of the clock driver receives the output signal from a selection circuit. The selection circuit outputs the signal at the scan clock input or the output signal from a PLL which is operated by the signal at the functional clock input. The scan clock input does not need to be connected directly to the selection circuit; there may also be a plurality of driver stages in-between, for example. The same applies to the output signal from the PLL. In addition to the signals at the scan clock input and at the output of the PLL, the selection circuit could also have further inputs, which increases the size of the selection. The selection circuit, which is supplied with the various clock signals, ensures that the clock drivers for the clock domains are supplied with a single signal, so that the synchronization is simplified.

In one embodiment, the selection circuit has an OR gate and a plurality of clock drivers connected upstream thereof. The inputs of the OR gate are operated by the outputs of a plurality of clock drivers. These clock drivers respectively have a clock input and an enable input. The clock input of the one clock driver is coupled to an output of the PLL, and the clock input of another clock driver is coupled to the scan clock input. The enable signals for the clock drivers in the selection circuit are synchronized to the signals at the clock inputs. This ensures that no spikes, i.e. short pulses which are shorter than the length of a clock pulse, occur on the clock lines.

If a plurality of selection circuits are provided, respective different PLL output signals may be received. This means that it is also possible to operate asynchronous clock domains.

A dedicated signal sequence register is provided for each clock domain so that all clock domains can be programmed independently of one another, which allows any combinations of clock pulses to be produced in the clock domains.

In one embodiment, the actuation circuit for the enable signals for the clock drivers is situated outside of the shift registers formed by the scan cells. In this arrangement, the actuation circuits have clock-operated circuit parts. These need to operate both during the scan chain shift mode and in normal operation. For this reason, they must not be overwritten by the scan chain shift mode.

One or more embodiments also provide an integrated circuit which has a scan clock input and also a PLL having at least one clock output. A multiplicity of flip-flops receives a respective clock signal and can be connected as a shift register in a scan chain shift mode. A multiplexer drives the clock inputs of the flipflops, with a distinction being drawn between at least three modes: in a functional mode, the output of the PLL is connected to the clock inputs of the flipflops. By contrast, in a scan chain shift mode, the signal at the scan clock input is connected to the clock inputs of the flipflops. And in a propagation time test, a selection of pulses produced by the PLL is routed to the clock inputs of the flipflops. In this case, the multiplexer is in a form such that the path of the output signal to the flipflops is the same length both in the propagation time test and in the functional mode. This ensures that different conditions for clock production do not occur in the propagation time test and in the functional mode. Hence, the propagation time test involves testing under conditions which are similar to those for the functional mode.

In addition, creation of the clock tree is simplified, since it can be created using the path in the functional mode without needing to give any consideration to the propagation time test.

If the PLL has a plurality of clock outputs, the propagation time test involves pulses from that clock output which operates the clock at the highest frequency being connected to the clock inputs of the flipflops. Consequently, the propagation time test involves testing at the highest frequency and hence under the hardest conditions.

One or more embodiments also relate to a computer program which is executed on a computer and prompts a computer to carry out an inventive method for identifying propagation time errors. In this case, the computer program controls the individual method processes.

The computer program may be held in a storage medium, for example on a CD-ROM or in a computer memory.

The invention also relates to an inventive computer program which is transmitted on an electrical carrier signal and to a data storage medium which contains such a computer program.

The computer program can also be downloaded from an electronic data network, such as the Internet, to a computer connected to the data network.

FIG. 1 illustrates input signals for an integrated circuit based on the invention. The integrated circuit 1 receives input signals IN, a first clock signal ECLK for the functional operation, a scan clock input SCAN_CLK and also the signals from the JTAG interface TDI, TCK and TMS for the boundary scan test. Output signals are the signals OUT and also the signal TDO, which is likewise used only by the JTAG interface.

Figure 2:
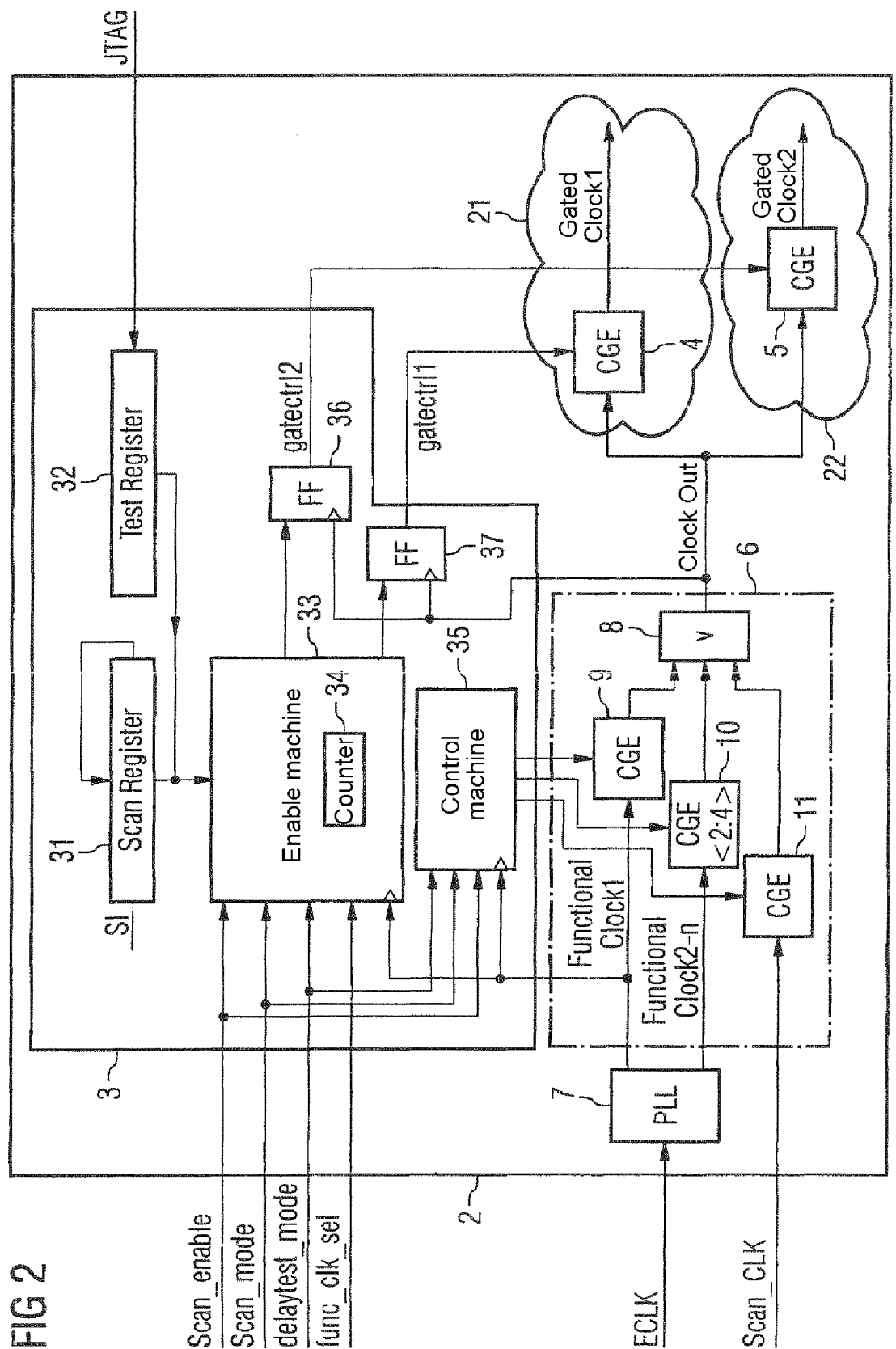
FIG. 2 illustrates details of an integrated circuit based on the invention.

FIG. 2 illustrates details from the integrated circuit presented in FIG. 1. The multi-clock-pulse generator 2 contains a clock enable generator 3, clock drivers 4 and 5, a selection circuit 6 and a PLL 7.

The PLL 7 receives the signal ECLK from the functional clock input and outputs a plurality of clocked signals, "Functional Clock1" and "Functional Clock2-4". "Functional Clock2-4" contains three clock signals "Functional Clock2", "Functional Clock3" and "Functional Clock4". The output signals from the PLL differ in terms of different frequencies or phases.

In the chosen example, "Functional Clock1" denotes the fastest clock which is chosen in functional operation at full load. The "Functional Clock2" is slower than the "Functional Clock1", which is used in a power-saving mode. The "Functional Clock3" is a clock which is connected to the input clock by bypassing the PLL, and the "Functional Clock4" is a clock which is supplied from an oscillator situated on the chip. The clock "Functional Clock 1" has a frequency of 400 MHz, whereas the input clock ECKL operates at 100 MHz. The clock signal "Functional Clock 2" operates at 10 MHz. The concept works with any number of functional clocks. In the example, a design with 4 functional clocks is described here.

The selection circuit 6 contains an OR gate 8 and clock drivers 9, 10 and 11. The clock driver 10 contains three clock drivers, each with a clock input and an enable input, the clock input being illustrated on the left and the enable input being illustrated at the top. The clock driver 9 receives the clock "Functional Clock 1", whereas the clock driver 10 receives the signal "Functional Clock2" as input clock and the clock driver 11 receives the signal "Scan_clk", which is supplied by the scan clock input.

The enable signals for the clock drivers 9, 10 and 11 are driven by the clock enable generator 3.

The output signals from the clock drivers 9, 10 and 11 are routed to the inputs of the OR gate 8, which outputs a clock signal "Clock Out".

The enable generator 3 contains a scan register 31, a test register 32, an enable machine 33 with an integrated counter 34, a control machine 35 and also two enable flipflops 36 and 37. The enable flipflops 36 and 37 are optional. They allow buffer-stored output of the signals and hence a simpler layout from the enable machine to the local clock drivers 4 and 5. This relaxes the timing constraints for the global signals. The pulse sequence is executed one clock cycle later in time, but the test execution remains the same.

The test register 32 receives signals from the JTAG in order to store the test settings. In addition, the scan register receives signals SI which are received from a scan input. This scan input is arranged independently of the JTAG interface. It is optionally also possible for the scan register 31 and the test register to be loaded from the same JTAG interface.

The scan register 31 and the test register 32 have their outputs connected to the enable machine 33, which also receives the signals "scan_enable", "scan_mode" and "delaytest_mode" and "func_clk_sel". The enable machine contains a counter 34 and also a signal sequence register (not illustrated in FIG. 4).

The output of the enable machine 33 actuates the data inputs of the flipflops 36 and 37. The clock inputs of the flipflops 36 and 37 are driven by the signal "Clock Out", which is actuated by the OR gate 8 in the selection circuit 6. The control machine 35 likewise receives "scan_enable", "scan_mode" and "delaytest_mode" and "func_clk_sel" as input signals. The control machine 35 actuates the enable inputs of the clock drivers 9, 10 and 11 in the selection circuit 6.

The output signal from the enable flipflop 36 is called "gatectrl2", and that from the enable flipflop 37 is called "gatectrl1".

Flipflops are used instead of a design based on latches. In this context, flip-flops are understood to mean clock-edge-controlled bistable multivibrators. By contrast, latches are switched transparently so long as a particular level is applied to an enable input.

The clock drivers 4 and 5 each have a clock input and an enable input. The clock inputs are respectively actuated by the output signal from the OR gate 8 "Clock Out".

As enable signal, the clock driver 4 receives the signal "gatectrl1". The signal "gatectrl2" forms the enable signal for the clock driver 5. The clock drivers 4, 5, 9, 10 and 11 are also called "Clock Gating Cells (CGC)".

A first clock domain 21, which has a multiplicity of flipflops and other gates (not shown here), also contains the clock driver 4, which produces the clock "Gated Clock1" for the clock domain 21. Likewise, the clock signal "Gated Clock2" for the clock domain 22 is driven by the clock driver 5.

The control machine 35 ensures that at most one clock path, i.e. one of the clock drivers 9, 10 or 11, is enabled. In the functional mode, i.e. normal application, the "Functional Clock 1" is used in the clock domains 21 and 22. The signal "scan_enable" puts the chip into the scan chain shift mode, in which the scan flip-flops are connected as shift registers. The signal "scan_mode" changes over from the clock ECLK to the signal SCAN_CLK. "delaytest_mode" is used to switch between propagation time test and stuck-at fault test, and "func_clk_sel" selects one of the four "Functional Clock" clocks.

The difference between functional operation and the tests is merely encoding of the enable signals for the clock drivers. The clock multiplexer controls all the clock switches with a single synchronous multiplexer implementation.

In the case of the "stuck-at fault" test, the integrated circuit has test patterns applied to it which have been ascertained using the "stuck-at fault" method known in the art. This test involves a test pattern in the scan pattern being written to the scan cells. Next, the scan chain shift mode is switched off and the circuit is operated for a few clock cycles. The scan chain shift mode is then switched on again and the values from the scan cells are read. During this entire test, the scan clock is used. To this end, the external test clock Scan_clk is forwarded to the clock domains 21 and 22.

For the test for identifying propagation time errors, on the other hand, the selection circuit 6 needs to switch to and fro between the slow "Scan_clk", which is needed in order to write the data to the scan registers, and the internal high-speed PLL clock.

A concept and an implementation for a multi-clock-pulse generator for propagation time tests in real time are described. In modern designs, the signal propagation time in internal paths is far shorter than via the paths, the external connections. While the external communication of the chip is slow, the internal chip runs much faster, it being operated by a PLL situated on the chip. In this case, it is not possible to transmit a high-frequency clock from the automatic test equipment (ATE) via a path to the chip. For this reason, the PLL situated on the chip is used in combination with a specific clock controller in this case.

There is uniform clock switching. The number of clock pulses for the launch/capture signal forms is user-programmable and is undertaken in parallel for a plurality of signal forms. In this context, testing of signals running between clock domains is supported for both synchronous and asynchronous clock domains.

The clock domains 21 and 22 are synchronous, since they are driven by the same PLL clock output. If additional asynchronous clock domains need to be operated, a further clock enable generator 3 is provided or a plurality of further clock enable generators 3 are provided.

The clock domains 21 and 22 differ in terms of the clock pulses in the functional mode. Whereas all pulses of the "Functional Clock 1" are allowed to pass for the clock domain 21, one of two clock pulses is allowed to pass and the other is gated out, respectively, for the clock domain 22. This is done because the signal paths between the clock domains 21 and 22 are relatively long and one signal more than the length of a clock pulse is required for the passage from a flipflop in the clock domain 21 to a flipflop in the clock domain 22. For this reason, only every second pulse is driven in the clock domain 22. The different clockings in the clock domains 21 and 22 mean that different signal profiles are needed so that all the possibilities of the signal profiles can be programmed for the clocks. In the present example, this is done individually for each clock domain so that the highest possible flexibility is ensured.

FIG. 3 illustrates the signal profiles for nodes situated in the circuit illustrated in FIG. 2. The upper part of FIG. 3 first of all illustrates the data stored in the signal sequence registers. For each clock domain, 21 bits are stored in the signal sequence register 40 in the present example. The first 5 bits indicate the length of the signal sequence, and the next 16 bits indicate the data in the signal sequence or the signal sequence marking. In this context, a "1" means that a clock pulse is allowed to pass and a "0" means that a clock pulse is ignored.

In the present example in FIG. 3, the signal sequence register is used to store the signal sequence 41 illustrated on the left for the clock domain 21 and the signal sequence 42 illustrated on the right for the clock domain 22.

If one of several clock domains requires individual setting for the multicycle paths, a dedicated clock enable generator is provided. If two domains share a signal path which is to be tested, the launch pulse needs to be programmed in a first register and the capture pulse needs to be programmed in a second register.

If the length of the signal sequence is set to zero, all the leading bits which have the value zero are ignored. For each value 1 to 16 of the wavelength register, the correct number of bits for the signal form is output to the clock domain.

First, the integrated circuit is initialized in the first "Shift" phase. For this, the integrated circuit 1 is put into a scan chain shift mode by using the signal "Scan_enable". The scan cells, i.e. the plurality of state storage elements situated in the integrated circuit, for example flipflops, are connected as a shift register. The start of the shift register is at the pin "Test Data In" and the output of the shift register is at the pin "Test Data Out". The flipflops in the shift register are actuated by using the clock "Scan_clk" which is applied to the scan input signal. In the selection circuit 6, the clock driver 11 is enabled, so that the output of the selection circuit 6 "Clock Out" outputs a clock whose signal form corresponds to that of the "Scan_clk".

Similarly, the enable signals for the clock drivers 4 and 5 have been activated, so that the clock signal for the first clock domain 21 and the clock signal for the second clock domain 22, "Gated Clock1" and "Gated Clock2", have the same signal form as the signal applied to the scan clock input.

This means that flipflops which are situated within the clock domains 21 and 22 can be connected as scan cells.

The test program contains an initialization phase which configures the PLL and the clock drivers in terms of the clock speed and the signal forms, for example.

The basic propagation time error test uses precisely two clock pulses. First, the path is prepared for the expected propagation time error. A signal change then takes place in the launch cycle. Finally, the correct or erroneous value is observed in the capture cycle. This approach works for a completely full scan design in which each sequential element is implemented as a scan flipflop. In practice, some parts of the circuit do not meet this requirement completely. Typical candidates for this are memory blocks and pipeline structures. Sometimes, the insertion of scan cells into sub-blocks of the design does not work either. In this case too, a propagation time test with just two pulses is inadequate. Instead, additional pulses need to be provided for the sequential test.

The selection circuit 6 forms a spike-free clock multiplexer. The control circuit 35 always ensures that only one clock path is activated. In the "stuck-at fault" test, both the writing to the scan cells and the launch and capture phase are produced by the Scan_clk which is generated by the ATPG.

When the scan cells are being programmed using the scan chain shift mode, the scan chain shift mode is switched off again by using a falling edge of the signal "Scan_enable". A subsequent rising edge of the signal "Scan_clk" initiates the launch and capture cycles. In the launch/capture phase, clock pulses for the clock domains 21 and 22 are produced so that the circuits in these domains behave as during functional operation. Only in this way can the behavior be tested as during application in order to detect any propagation time errors.

The launch/capture phase is started by using the rising edge on the scan clock input in order to save an additional pin. During the propagation time error test outside of the scan chain shift mode, the "Scan_clk" no longer has the function of acting as a clock signal for the scan signals. Instead, it controls the signals "enable ctrl1" and "enable ctrl2", which are internal signals in the control machine 35. The control machine 35 uses the enable signal for the clock driver 9 to enable the latter for nine clock cycles. The output signal from the selection circuit 6 "Clock Out" thus outputs nine clock pulses. These clock pulses are at a high frequency, as produced by PLL. The PLL is an accompaniment to the scan chain shift mode. To this end, a clock needs to be applied to the functional clock input. The PLL is running even before the actual launch/capture phase because it requires time to lock.

The length of the signal sequence 41 for the clock domain 21 is 8 bits, which is encoded as "111" in the example. In this case, the last and the third-from-last clock pulses are output, as can be seen from the signal sequence masking. The length of the signal sequence 42 in the clock domain 22 is 9 bits. In this case, a respective clock pulse is output in the third, eighth and ninth clock cycles.

The signal sequence registers allow user-programmable signal sequences of 16 pulses. Thus, all possible combinations of pulses relating to signals within clock domains and between clock domains can be generated. The launch/capture phase is again followed by a shift phase. This phase is started by a rising edge of the signal "Scan Enable". Again, the clock signal at the scan input is activated in order to output the data stored in the scan cells at the output "Test Data Out".

Alternative encoding can be used in the form of sequential encoding. In this context, the signal sequence is encoded using three parts. In the first part, a signal sequence to be repeated is indicated, the second part encodes a repetition factor and the third part indicates the end of the signal sequence, the end being output only once.

FIG. 4 illustrates the signal profiles for the clock signals at nodes in the integrated circuit illustrated in FIG. 2. To this end, a detail from FIG. 2 is illustrated. The signal "Scan_clk" has a slow clock applied to it, while one of the outputs of the PLL outputs the high-frequency "Functional Clock" clock. The signal "Clock Out" first of all outputs a pulse with a large pulse width and then a plurality of pulses with a small pulse width and, at the end, again a pulse with a large pulse width. The output of the clock drivers 4 and 5 outputs the clocks "Gated Clock1" and "Gated Clock2", for which some of the pulses with short pulse lengths in comparison with the signal "Clock Out" have been gated out.

The implementation illustrated for the clock paths for the clock inputs ECLK and Scan_clk has advantages for the generation of the clock tree. A single clock tree from the PLL to the flipflops is provided for the functional operation and for the propagation time test. A clock tree denotes the branching of a clock signal from a source, for example a PLL, to the receivers of the clock. In this case, the receivers are the flipflops in the clock domains 21 and 22.

The source is subsequently referred to as the root, the receivers are subsequently referred to as the leaves and the passage between the root and the leaf is subsequently referred to as a path. Skillful proportioning of the paths ensures that a clock signal emitted by the root reaches all the leaves as simultaneously as possible. The remaining difference between the reception times is called the skew. The skew reduces the period in which a data input signal can be reliably received by the flip-flops. Attempts are therefore made to keep the skew as small as possible.

When designing the clock tree, all delays in the paths from the root to the leaves are calculated. To this end, each path should be unique, i.e. there is just one path and not two or more paths from the root to a particular leaf.

By contrast, in the case of implementations in which there are two paths of different length for the passage between a particular root and a particular leaf, a multiplexer switches to and fro between these two paths of different length. In this case, the clock tree needs to be optimized for both paths. By way of example, the two paths arise if the clock signal is routed via more gates in a propagation time test than in functional operation.

On the one hand, the optimization for two paths increases the complexity, especially since the computer programs are not designed to create a clock tree when there are a plurality of parallel paths per leaf. On the other hand, the skew is also increased because the clock path needs to be optimized simultaneously for a plurality of paths.

In the arrangement illustrated in FIG. 2, the clock tree for the clock domain 21 is designed only for the path of the signal "Functional Clock 1" to the receivers in the clock domain 21. The arrangement of the clock driver 9 and of the OR gate 8 allows this path to be of the same length both in the case of the propagation time test and in the functional mode. The path from the root "Functional Test 1" to a leaf of the "Gated Clock 1" runs via the clock driver 9, the OR gate 8 and the clock driver 4 both in the functional mode and in the case of the propagation time test. The clock tree is therefore calculated and optimized just for one path. The clock paths from the other clock sources "Functional Clock 2", "Functional Clock 3", "Functional Clock 4" and "Scan_clk" to the receivers may be somewhat longer than the path "Functional Clock 1". This does not matter, however, because the difference between the delay to a leaf and the delay to another leaf remains the same. For creating the clock tree, only the calculations of the paths from the "Functional Clock 1" to the leaves are therefore relevant. In this case, the fastest clock, in this case "Functional Clock 1", is chosen because operation of the fastest clock involves the greatest demands on little skew.

The longer a path from the root to the leaves, the more the delay from the root to a leaf fluctuates. This also increases the skew. To counteract this, the largest possible clock drivers and intermediate drivers are used in order to achieve short propagation times for the clock. However, the large clock drivers also increase the power consumption, which means that a compromise is selected between the size of the clock driver and the power consumption.

The clock drivers and intermediate drivers are proportioned such that the delays on the paths for "Functional Clock 1" are no shorter than the delays on the paths for the other clock signals. This ensures that larger skews are not produced for the other clock signals than for the clock with "Functional Clock 1". The paths are designed such that the paths for the various clocks are the same length.

FIG. 5 illustrates details of a synchronization circuit for clock drivers. The clock drivers 9, 10 and 11 already illustrated in FIG. 2 receive the enable signals f1, f2 and c3, with the enable signal f1 being derived from the control signal c1 and the enable signal f2 being derived from the control signal c2. The control signals c1, c2 and c3 are supplied by the control machine 35. These enable signals for the clock drivers 9, 10 and 11 need to be in sync with the restrictive input clock signals "Functional Clock 1", "Functional Clock 2" and "Scan_clk" so that spikes are avoided. Spikes are short pulses on clock lines whose pulse length is shorter than that of the clock pulse. Spikes can result in malfunctions in the circuits and therefore need to be avoided.

The synchronization block 51 is provided for the clock driver 9, and the synchronization block 52 is provided for the clock driver 10. The clock driver 11 does not require a synchronization circuit, since the tester programs the signal for scan chain shift mode and scan clock such that no spikes arise during changeover of the scan chain shift mode. This means that a synchronization circuit is superfluous in this case.

Each synchronization block 51 and 52 has three series-connected D-type flipflops 53, 54 and 55. The clock inputs of the D-type flipflops 53, 54 and 55 in the synchronization block 51 are connected to the "Functional Clock 1", and the clock inputs of the D-type flipflops 53, 54 and 55 in the synchronization block 52 are connected to the "Functional Clock 2". The D-type flipflops 53 and 54 ensure that the output signals from the flipflops 54, which form the enable signal f1 in the synchronization block 51 and the enable signal f2 in the synchronization block 52, are respectively in sync with the respective input clock signals.

For the "stuck-at fault" test, the scan_clk is always meant to be passed through to the clock domains 21 and 22. This is intended to be done regardless of the state of the control machine and of the flipflops 53-55. There is the risk that there is no clock and there is no guarantee of the desired state being reached if the PLL is not activated for the "stuck-at fault" test. For the "stuck-at fault test", the flipflops 53-55 are therefore forced into the reset state asynchronously, which means that "Functional Clock 1" etc. are blocked regardless of their clock source.

In summary, it can be stated that the approach is based on reuse of the PLL which is on the chip and of the clock generation unit for the purposes of the propagation time test, which is also called a "delay fault test".

It is important to ensure correct functional timing during the propagation time test. The user-programmable signal sequence allows particular clock pulses to be suppressed in order to simulate the behavior of the scheme of the functional test.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for identifying propagation time errors in integrated circuits comprising:
    defining an integrated circuit to include a multiplicity of scan cells, a functional clock input, a scan clock input and a multiplicity of clock domains, wherein the scan cells are connected as shift registers in a scan chain shift mode and each clock domain is operated by a dedicated clock driver situated in the integrated circuit;
    switching the scan chain shift mode on;
    shifting data into the scan cells by using signal changes at the scan clock input;
    applying clock signals to the functional clock input;
    programming signal sequence registers;
    switching the scan chain shift mode off;
    generating from the clock on the functional clock input, a multiplicity of clock signals in at least one clock domain according to values stored in the signal sequence registers;
    checking if propagation time errors have occurred in the clock domain operated; and wherein the generation of the clock signals is initiated by a signal change at the scan clock input.

2. The method of claim 1, wherein the clock signals are applied even before switching the scan chain shift mode on.

3. The method of claim 1, wherein the signal sequence registers are programmed via a JTAG interface.

4. The method of one of claim 1, wherein the scan chain shift mode is switched on again.

5. The method of claim 1, wherein the signal sequence registers are respectively used to store signal sequences, whereby a length of a signal sequence and values for the signal sequence are stored for each clock domain.

6. The method of one of claim 1, wherein clock signals are produced in a plurality of clock domains.

7. The method of claim 6, whereby a PLL output drives the clock drivers of each of the plurality of clock domains.

8. The method of claim 6, wherein the clock drivers are operated by different PLL outputs.

9. A computer program which is executed on a computer and prompts the computer to carry out the method of one of claim 1.

10. The method in which the computer program of claim 9 is downloaded from an electronic data network, to the computer connected to the data network.

11. An integrated circuit, comprising:
a functional clock input;
a scan clock input;
a multiplicity of clock domains;
in the clock domains a multiplicity of scan cells which are connected as shift registers in a scan chain shift mode and receive the clock from the scan clock input;
for each clock domain at least one clock driver which is situated in the integrated circuit and which drives circuits situated in the clock domain;
each clock driver in the clock domain contains a clock input and an enable input; and its output outputs the clock received at the clock input if an enable signal is applied to the enable input; and
wherein the clock driver receives a clock derived from the signal at the functional clock input; and the enable signal is connected according to values stored in signal sequence registers if there is a signal change at the scan clock input after the scan chain shift mode has been switched off.

12. The integrated circuit of claim 11, comprising wherein the clock input of the clock driver receives the output signal from a selection circuit, wherein the selection circuit outputs the signal at the scan clock input or the output signal from a PLL which is operated by the signal at the functional clock input.

13. The integrated circuit of claim 12, comprising wherein the selection circuit has an OR gate and plurality of clock drivers and the inputs of the OR gate are driven by the outputs of a plurality of clock drivers which respectively have a clock input and an enable input, wherein the clock input of one of the clock drivers is coupled to the output of the PLL and the clock input of the other clock driver is coupled to the scan clock input, and the enable signals are synchronized to the signals at the clock inputs of the one of the clock drivers and of the other clock drivers by using a synchronization circuit.

14. The integrated circuit of claim 12, comprising wherein a plurality of selection circuits are provided which respectively receive different PLL output signals at the clock inputs of their clock drivers.

15. The integrated circuit of one of claim 11, comprising actuation circuits for the enable signals for the clock drivers, wherein the actuation circuits have clock-driven circuit parts which are situated outside of the shift registers formed by the scan cells.

16. An integrated circuit, comprising:
a scan clock input;
a PLL having at least one clock output;
a multiplicity of flipflops which respectively receive a clock signal and which are connected as shift registers in a scan chain shift mode;
a multiplexer which drives the clock inputs of the flipflops; and
switches the output of the PLL to the clock inputs of the flipflops in a functional mode;
switches the signal at the scan clock input to the clock inputs of the flipflops in the scan chain shift mode;
and switches a selection of pulses produced by the PLL to the clock inputs of the flipflops in a propagation time test; and
wherein the multiplexer is in a form such that a path of the output signal to the flipflops is a same length both in the propagation time test and in the functional mode.

17. The integrated circuit of claim 16, comprising wherein the PLL has a plurality of clock outputs; and wherein in the propagation time test pulses from that clock output which drives the clock at the highest frequency are connected to the clock inputs of the flipflops.

* * * * *